United States Patent [19]

Walker et al.

[11] Patent Number: 5,021,704
[45] Date of Patent: Jun. 4, 1991

[54] METHOD AND APPARATUS FOR COOLING ELECTROLEDELESS LAMPS

[75] Inventors: Delroy O. Walker, Hyattsville, Md.; Demetri P. Telionis, Blacksburg, Va.

[73] Assignee: Fusion Systems Corporation, Rockville, Md.

[21] Appl. No.: 482,534

[22] Filed: Feb. 21, 1990

[51] Int. Cl.$^5$ .......................... H01J 7/26; H01J 61/52
[52] U.S. Cl. ........................................ 313/35; 313/44; 315/248
[58] Field of Search ........................... 313/35, 36, 44; 315/248

[56] References Cited

U.S. PATENT DOCUMENTS

| | | | |
|---|---|---|---|
| 4,485,332 | 11/1984 | Ury et al. | 315/248 X |
| 4,695,757 | 9/1987 | Ury et al. | 313/44 |
| 4,894,592 | 1/1990 | Ervin et al. | 315/248 |
| 4,947,080 | 8/1990 | Wood et al. | 315/248 |

FOREIGN PATENT DOCUMENTS 56156064  5/1979  Japan .

Primary Examiner—Sandra L. O'Shea
Attorney, Agent, or Firm—Pollock, Vande Sande & Priddy

[57] ABSTRACT

Apparatus for cooling the lamp envelope of an electrodeless lamp which includes a conduit for carrying cooling gas into the vicinity of the lamp envelope and directing the cooling gas towards the lamp envelope through a slotted orifice in a wall of the conduit. The slotted orifice is preferably oriented with its long dimension substantially perpendicular to the conduct orifice and substantially parallel to the axis of a rotating lamp envelope.

18 Claims, 7 Drawing Sheets

FIG. 3C
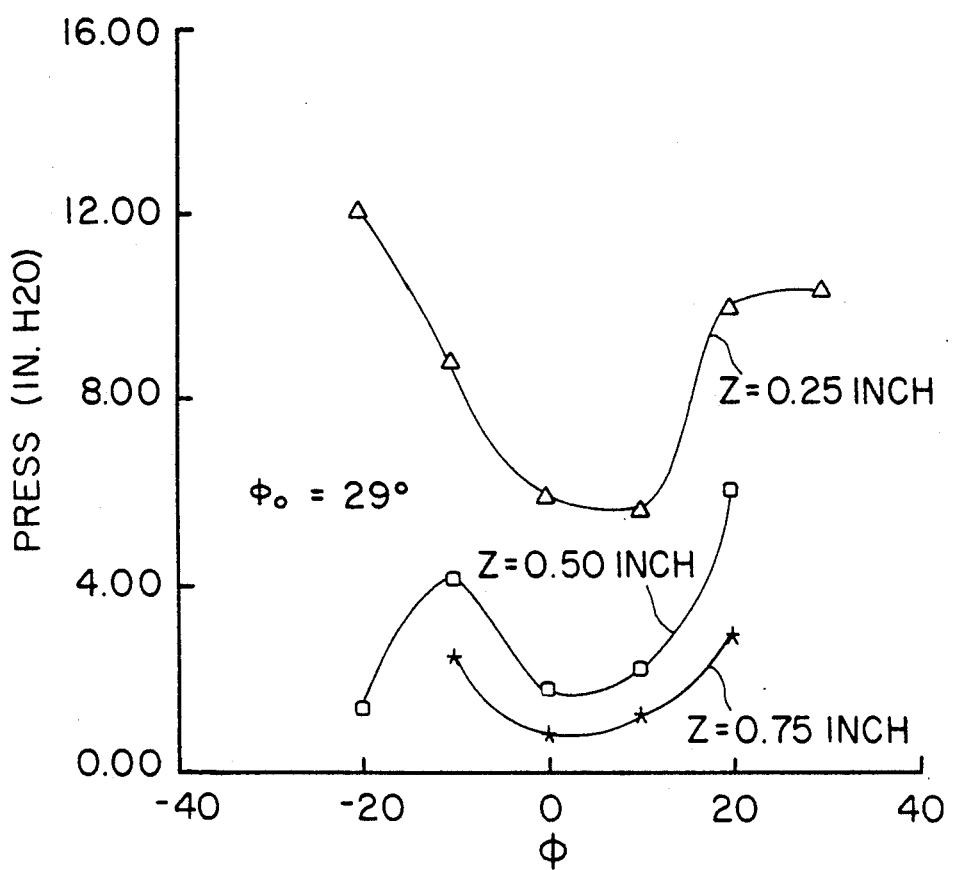
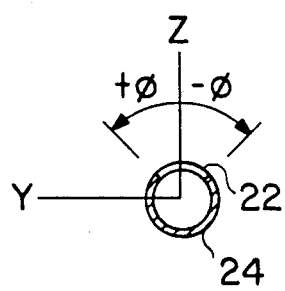
FIG. 3B
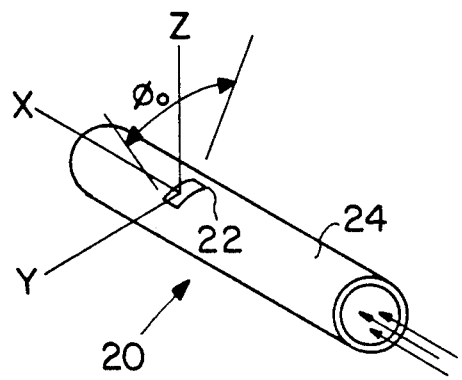
FIG. 3A

FIG. 3D
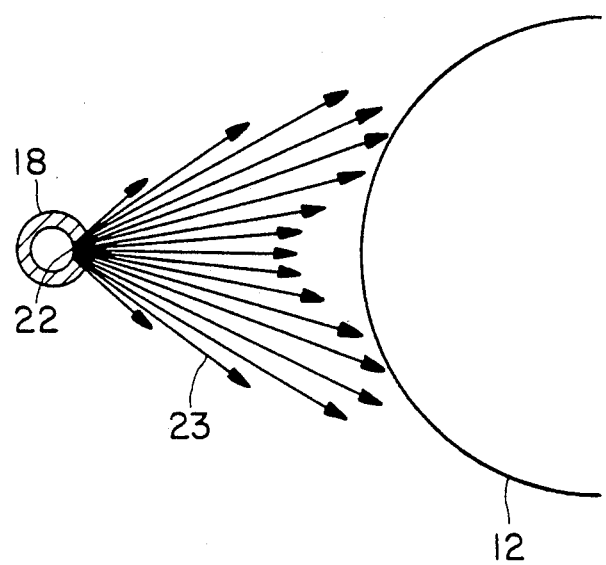
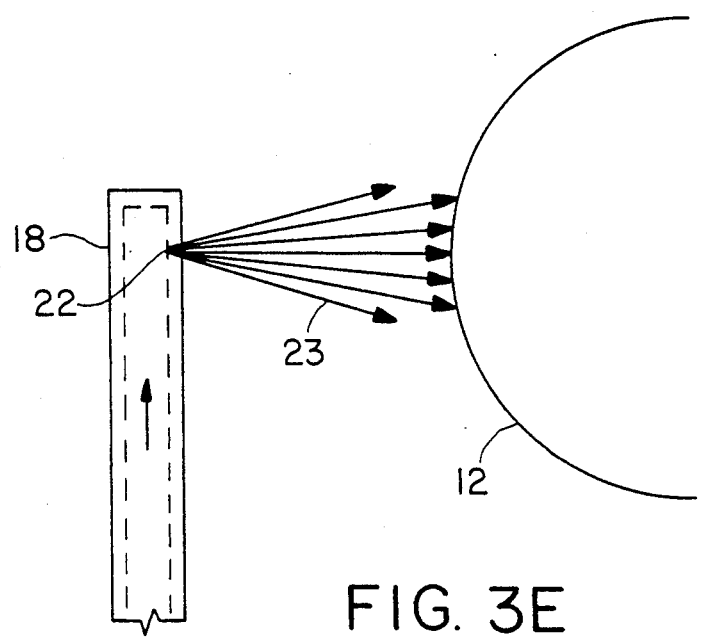
FIG. 3E

FIG. 4B
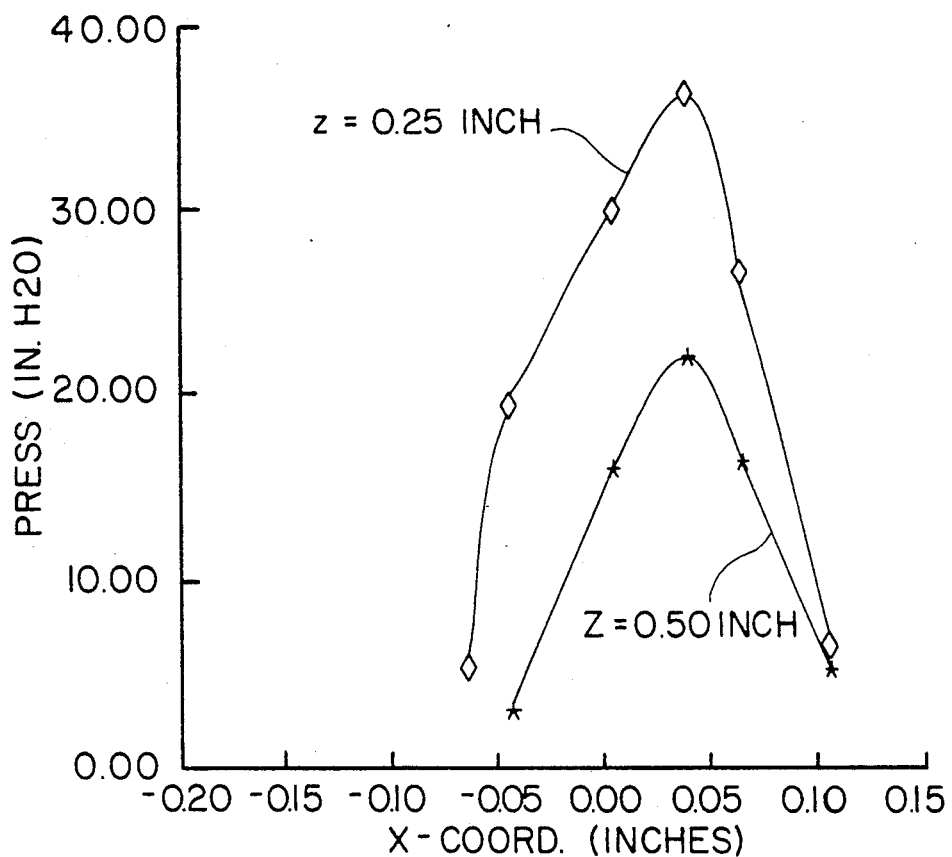
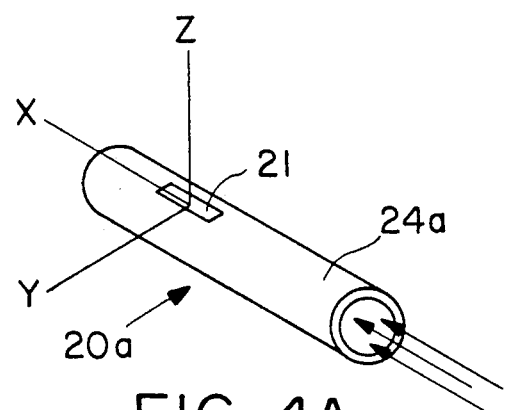
FIG. 4A

METHOD AND APPARATUS FOR COOLING ELECTROLEDELESS LAMPS

The present invention is directed to a method and apparatus for cooling electrodeless lamps.

BACKGROUND OF THE INVENTION

The electrodeless lamps with which the present invention is concerned generally comprise a lamp envelope containing a plasma-forming medium. The medium in the envelope is excited with microwave, RF or other electromagnetic energy, thereby generating a plasma which emits radiation in the ultraviolet, visible or infrared part of the spectrum. Important uses for such electrodeless lamps to date include curing coatings or inks by photopolymerization reactions, and semiconductor photolithography.

It is known that electrodeless lamps transfer a great deal of heat to the lamp envelopes during operation, and it has been found that the effectiveness with which the lamp envelopes are cooled limits overall lamp performance. Thus, the brightness with which energy is radiated by the lamp increases with the power density of the microwave or other energy in the lamp envelope; however, as the power density increases, so does envelope temperature, with a temperature being reached where the envelope melts if it is not adequately cooled. Therefore, the brightness which can be obtained from a lamp is ultimately a function of cooling. Also, in the case where a lamp is operating satisfactorily at a given envelope temperature, cooling the envelope to a lower temperature has the effect of substantially increasing bulb lifetime.

In one technique which has been used to cool electrodeless lamps, air is passed over a stationary lamp envelope. U.S. Pat. No. 4,042,850 describes one such method of cooling, which involves forcing air from a compressor into a lamp chamber over the lamp envelope. The power density achieved by this method of cooling is reported to be in the range of about 100 watts per cubic cm of lamp envelope volume. In an improvement described in U.S. Pat. No. 4,485,332, the lamp envelope is rotated while at least one stream of cooling gas is passed over the envelope surface. Using this method of cooling, a power density of about 500 watts per cubic cm. of lamp envelope volume has been obtained. However, even with this method, some hot spots remain which limit the average power density which can be achieved. At least a part of the non-uniform temperature is the result of uneven flow of cooling gas over the surface of the envelope.

SUMMARY OF THE INVENTION

Accordingly, it is one object of the present invention to provide an improved method and apparatus for cooling a lamp envelope of an electrodeless lamp.

It is another object to modify the distribution of the cooling gases flowing towards a lamp envelope.

It is a further object of this invention to eliminate hot spots on a rotated, forced-gas cooled bulb.

It is still another object of this invention to provide an improved stream of cooling gas for use with a rotating bulb.

Other objects of this invention will be obvious from the following description and the claims appended thereto.

In accordance with this invention, apparatus is provided for cooling an electrodeless lamp having a lamp envelope which is mounted within a chamber and which becomes extremely hot during operation. The apparatus includes a source of cooling gas under pressure, conduit means for conveying cooling gas from the source to the chamber and cooling gas outlet port means in a wall of the conduit means wherein the outlet port means is a slotted orifice oriented to direct a stream of cooling gas at the lamp envelope.

A method for cooling such a lamp envelope of an electrodeless lamp is also provided, in which the lamp envelope is rotated about an axis and a cooling gas is directed toward the lamp envelope through a slotted orifice. The term "slotted orifice" is intended to mean an opening in a conduit wall which is of a generally oblong shape, the sides of which may be straight, as in a rectangle, or curved as in an ellipse.

This invention provides an improvement in the cooling of a lamp envelope with concomitant higher power densities possible, and the elements used to introduce the cooling gases to the lamp envelope are more easily fabricated than the elements used in the prior art to provide a stream of cooling gas to the lamp envelope. Slots can readily be cut in a wall of a tube, such as by mechanical means or by a laser, whereas nozzle jets are expensive to fabricate. This invention is also useful with a stationary lamp envelope as well as one which is rotating.

For a rotating envelope, the use of a slotted orifice increases the extent of coverage of the stream of cooling gas along lines of longitude at no expense to the cooling along lines of latitude since the envelope is rotating.

BRIEF DESCRIPTION OF THE DRAWINGS

FIG. 3A is a perspective view of a gas conduit provided with a transverse slot in accordance with the present invention.

FIG. 3B is a view in cross-section of the gas conduit of FIG. 3A.

FIG. 3C is a graph of the pressure of gases flowing from a transverse slot, as shown in FIG. 3A, as a function of the angular distance from the centerline of the slot.

FIG. 3D is a diagrammatic representation of the pressure profile of gas flowing from a transverse slot as viewed along the conduit axis.

FIG. 3E is a diagrammatic representation of the pressure profile of gas flowing from a transverse slot as viewed along the long dimension of the slotted orifice.

FIG. 4A is a perspective view of a gas conduit which is provided with a longitudinally slotted orifice.

FIG. 4B is a graph of the pressure of gases flowing from the longitudinal slot of FIG. 4A as a function of the X-coordinate of the slot.

DETAILED DESCRIPTION OF THE PREFERRED EMBODIMENT

Figure 1:
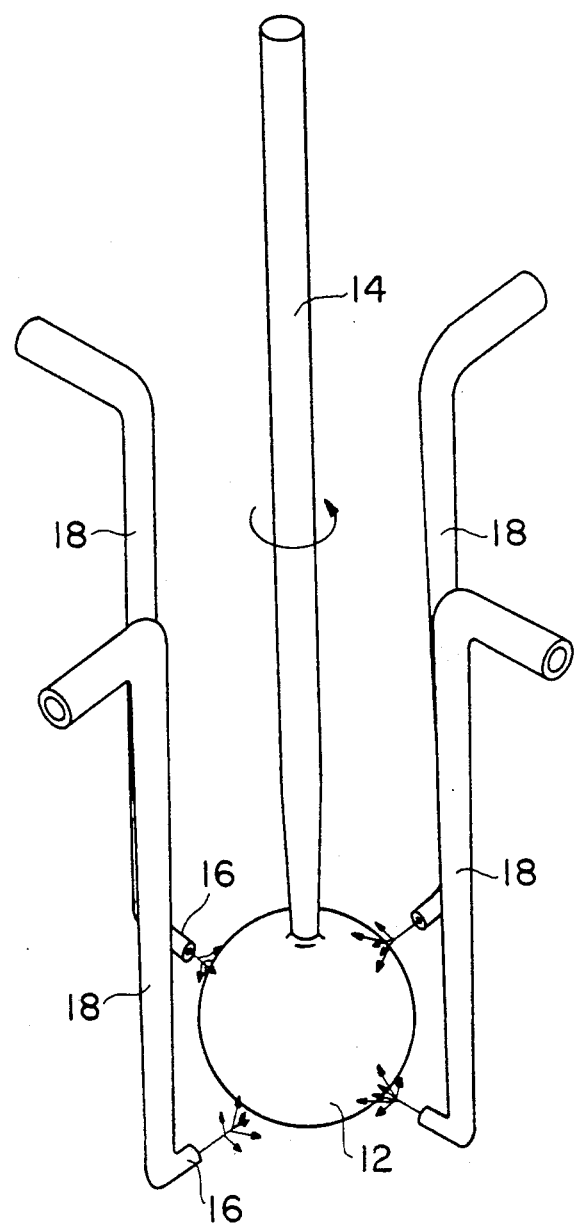
FIG. 1 ia a perspective view of a rotating lamp envelope being cooled by nozzle jets according to the prior art.

FIG. 1 represents a prior art method of cooling a spherical electrodeless lamp envelope 12 by passing cooling gases through conduits 18 through nozzle jets 16 and onto the surface of lamp envelope 12. In the structure shown in FIG. 1, envelope 12 is rotated by stem 14 which is driven by means such as an electric motor (not shown).

Details of gas cooling and lamp envelope rotation structures are described in U.S. Pat. No. 4,485,332 to Ury et al, U.S. Pat. Application Ser. No. 197,351 to Ervin et al, now U.S. Pat. No. 4,894,592 for "Electrodeless Lamp Energized by Microwave Energy" and in U.S. Pat. Application Ser. No. 391,011 to Wood et al now U.S. Pat. No. 4,947,080 for "Apparatus for Rotating an Electrodeless Light Source", and the disclosures therein are incorporated herein by reference.

In the cooling apparatus of the present invention, the nozzle 16 has been replaced with a slotted orifice which has been formed in a wall of the conduit. The slotted orifice may be in an end wall of the conduit or it may be in a sidewall and may be a transverse slot, a longitudinal slot, or a slot at an angle between transverse and longitudinal.

Figure 2B:
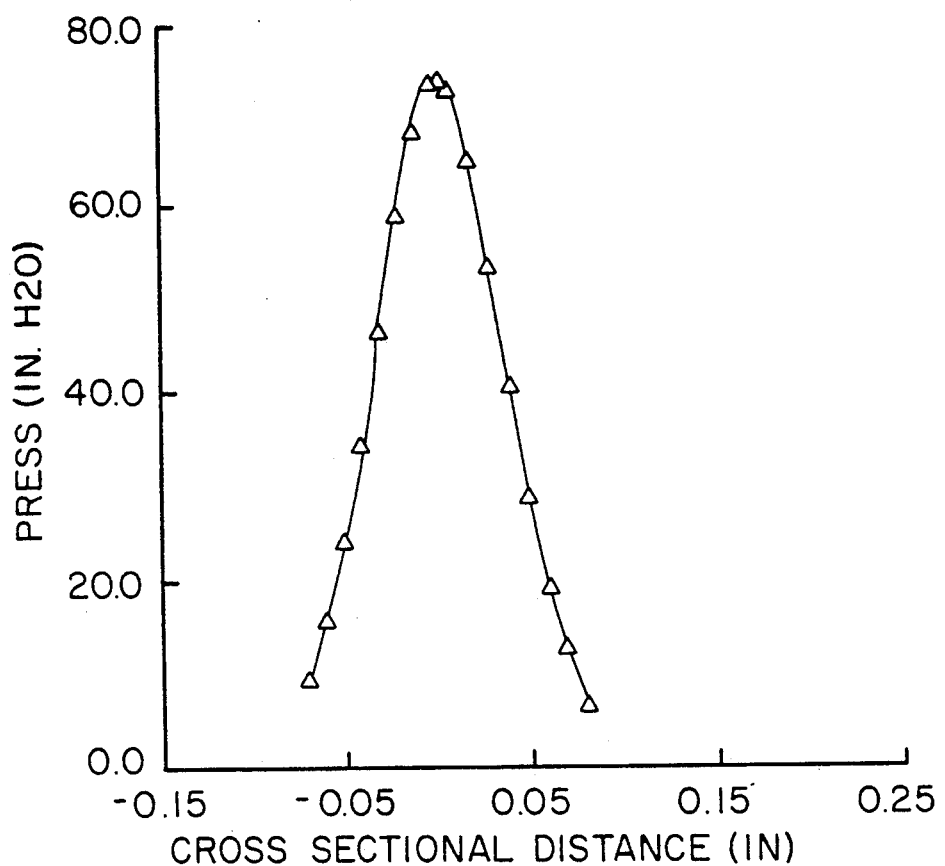
FIG. 2B is a graph of the pressure of gases flowing from a prior art nozzle jet, as depicted in FIG. 2A, as a function of distance from the axis of the nozzle.
Figure 2A:
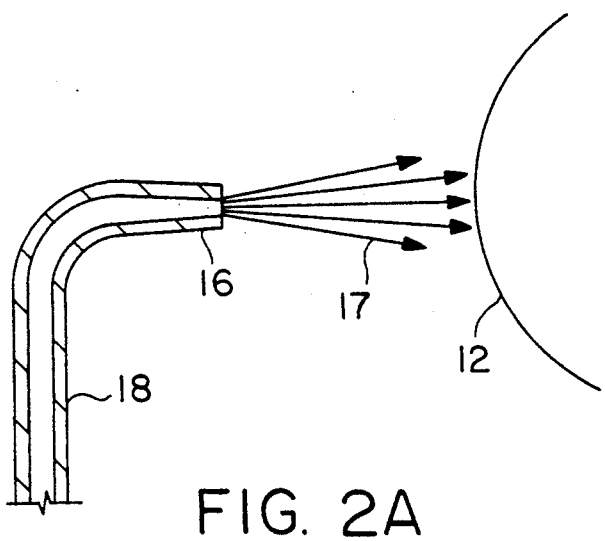
FIG. 2A is a diagrammatic representation of the pressure profile of gas flowing from a prior art nozzle jet as shown in FIG. 1.

FIG. 2A is a diagrammatic representation of the pressure of gases which issue from a nozzle jet 16 at the end of conduit 18 and flow towards spherical lamp envelope 12. The lengths of the lines 17 depicting the flow of gases are indicative of the relative pressures across the nozzle diameter. As is shown, the highest pressure of the gas flowing from the orifice is at about the center of the nozzle.

The curve in FIG. 2B is a plot of the pressure of the gas issuing from a nozzle jet, as shown in FIG. 2A, as a function of the distance from the axis of the nozzle. The pressures were measured at a distance from the discharge opening of about 6.5 times the diameter of the discharge opening and at a system pressure of about 4.2 psi. As can be seen, the pressure is greatest at the nozzle axis and decreases rapidly as the distance from the axis increases.

FIG. 3A is a perspective view of an embodiment of the present invention showing a conduit 20 having a transverse slot 22 formed in a sidewall 24 through angle φ in the Y-Z plane. FIG. 3B is a cross-section view of the conduit shown in 3A in the Y- plane.

FIG. 3C is a graph of the pressure of gases issuing from the transverse slot 22 as a function of the angular distance φ from the midline of the slot at distances along the Z axis of 0.25, 0.50 and 0.75 inches for a slot extending 29° around the conduit circumference. As can be seen, the pressure of gas near the midline of the slot is substantially lower than the pressures of gases which are on either side of the midline.

FIG. 3D is a diagrammatic representation of the pressures of gases which flow from the transversely slotted orifice of FIG. 3A as viewed along the X axis. The lengths of arrows 23 are representative of the pressures of the gases issuing from various portions of the slot. As can be seen, there are two pressure peaks, one on either side of the central part of the slot. This distribution results in a increase in the area of the lamp envelope on which the cooling gases impinge.

Figure 6:
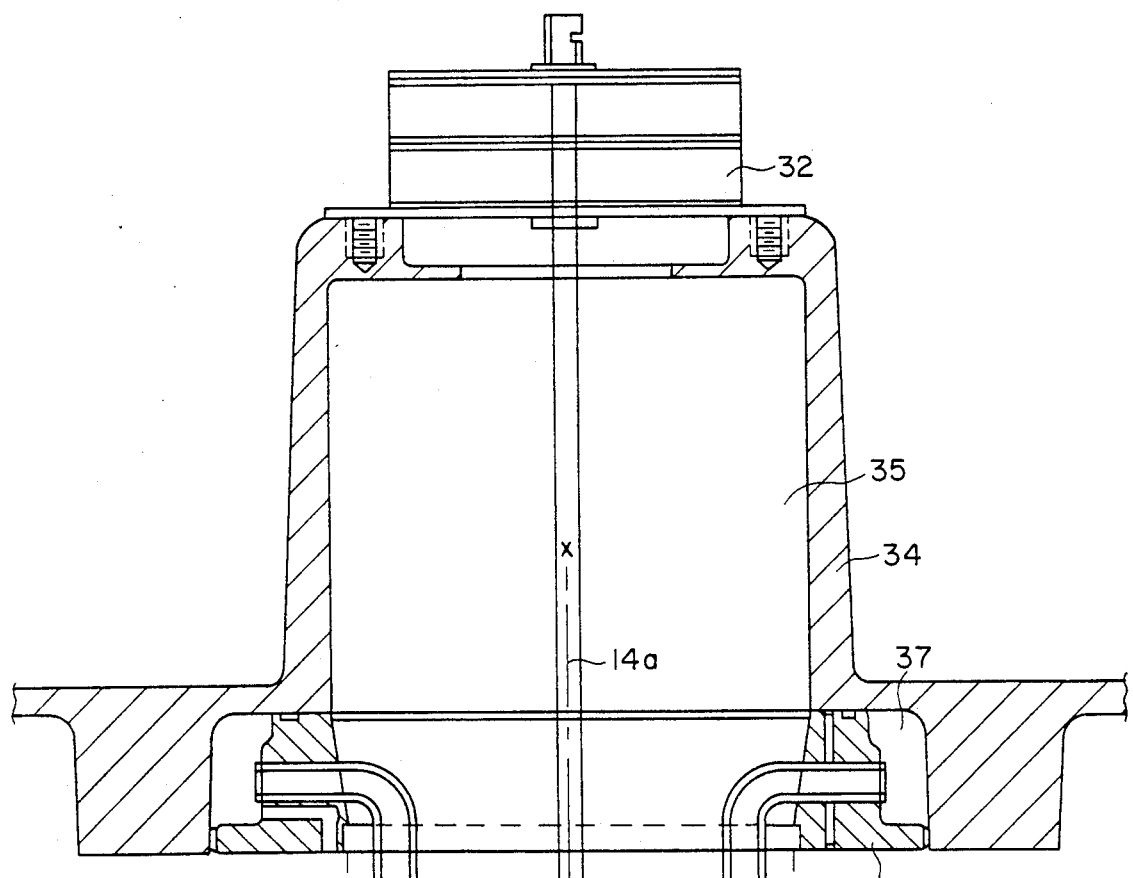
FIG. 6 is a view in cross-section of an electrodeless lamp showing a rotating lamp envelope being cooled by gases issuing from a transverse slot in a conduit.

FIG. 3E illustrates the pressure profile of gases issuing from the slotted orifice 22 as viewed along the Y axis. Viewed from this direction, the pressure at various points in the path of the gases and in a plane which is perpendicular to the long dimension of the slot are more nearly equal. In order to take maximum advantage of the distribution of gases from a transverse slot, as shown in FIGS. 3A and 3B, the slot is oriented so that it is substantially parallel to the axis of a rotatable lamp envelope as shown in FIG. 6.

FIG. 4A shows an embodiment of a slotted orifice of the present invention in which slot 21 in wall 24a is substantially parallel to the axis of conduit 20a. As can be seen from the graph of FIG. 4B, the pressure of gases is greatest in the longitudinal direction at about the intersection of the X coordinate with the Y, Z coordinates.

Figure 5:
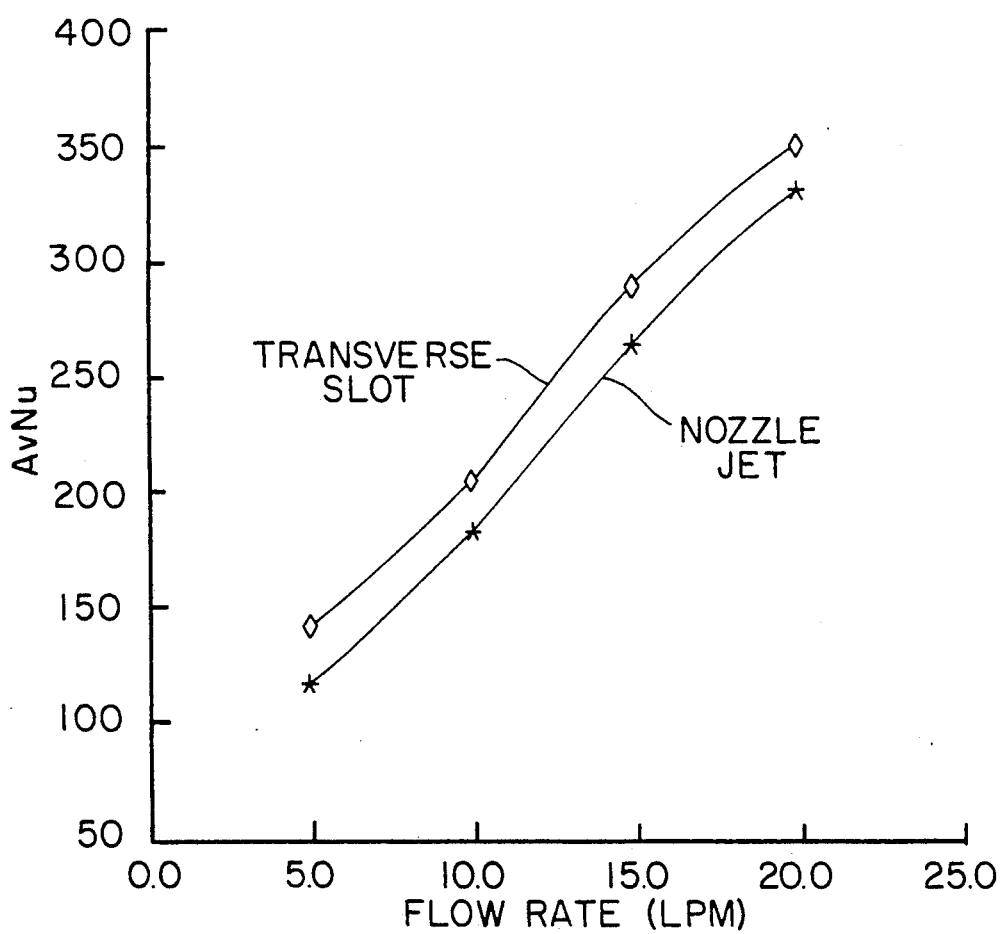
FIG. 5 is a graph of the average Nusselt number as a function of flow rate of gases for a transverse slot and a nozzle jet.

FIG. 5 is a plot of the average Nusselt number as a function of flow rate of gases which issue from a transverse slot, as shown in FIG. 3A, and a nozzle jet, as shown in FIG. 1. As can be seen, for any given gas flow rate, the average Nusselt number for gas issuing from a transverse slot is significantly higher than for gases issuing from the nozzle jet. The average Nusselt number is a measure of heat transfer capability, and thus, it can be seen that the gases which issue from the transverse slotted orifice are more efficient in cooling a lamp envelope than are gases issuing from the nozzle jet. The use of such a slotted orifice to direct cooling gases toward the lamp envelope of an electrodeless lamp takes advantage of the increased cooling efficiency of the gases and the simplified fabrication of the slots compared to prior art jets.

The slotted orifice is of a generally oblong shape, may have either straight or curved sides, may have enlarged ends, and is preferably symmetrical about its centerlines. The ratio of length to width is preferably at least about 2:1, and is most preferably in the range of 3:1 to 8:1. A transverse slotted orifice in the sidewall of a cylindrical conduit may suitably extend through an angle from about 5° to about 60°, and preferably extends through an angle of about 30°. The orientation of the long dimension of the slotted orifice with respect to the conduit axis establishes the shape of the stream of cooling gas which issues from the orifice. A stream of cooling gas which issues from a slotted orifice which is parallel to the axis of the conduit, as shown in FIG. 4A, is substantially circular in cross-section. Gases flowing through a slot, the long dimension of which is substantially perpendicular to the axis of the conduit, as shown in FIG. 3A, are spread fan-like in the lengthwise direction of the slot. Not only are the gases spread fan-like, but the gas pressures are greater in portions near either end of the slot than in the portion at the center line of the slot. The present invention takes advantage of this phenomenon in an embodiment which employs a transverse slot to direct cooling gas at a substantially spherical lamp envelope. The fan-like shape of the stream of cooling gas results in an increased area of the lamp envelope which is in contact with the stream of gas issuing from the orifice. In a preferred embodiment, in which the lamp envelope is rotated, a transverse slot is oriented so that its longer dimension is at an angle from about 0° to about 60°, and most preferably about 0° with respect to the rotational axis of the lamp envelope, and is at an angle from about 30° to about 90°, and most preferably about 90° with respect to the conduit axis.

The electrodeless lamp shown in FIG. 6 comprises a microwave chamber 35 and a lamp envelope 12a mounted therein. Microwave chamber 35 is defined by microwave reflecting wall 34 and mesh assembly 33 which is effective to retain microwave energy in the microwave chamber, and yet allow light emitted by lamp envelope 12a to escape. Mesh assembly 33 is cup-shaped and comprises end mesh 30, cylindrical side wall mesh 28, and ring 29 for interconnecting end mesh 30 with side wall mesh 28. Chamber 35 has an opening therein (not shown) for admitting microwave energy.

Figure 7:
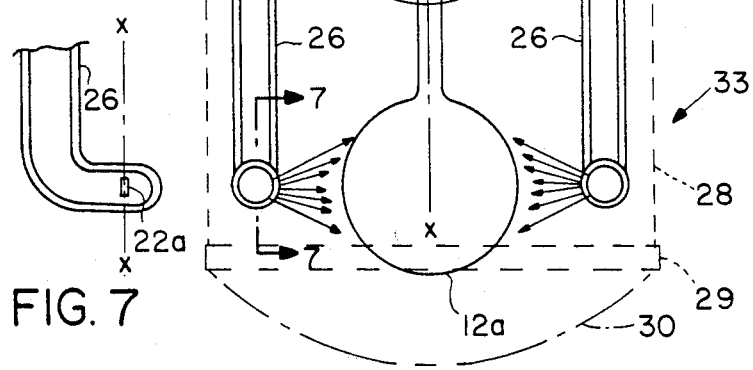
FIG. 7 is a view along line 7—7 of FIG. 6.

Lamp envelope 12a is filled with a plasma-forming medium such as, for example, mercury in a noble gas, which when excited with microwave energy, becomes a hot plasma and emits ultraviolet radiation. Lamp envelope 12a is supported within chamber 35 by stem 14a, and is rotated by motor 32. Hot envelope 12a is cooled by a cooling gas which is introduced into chamber 35 from a source of cooling gas (not shown) through manifold 37 and into conduits 26 which are supported in chamber 35 by support block 36. Cooling gas is directed toward lamp envelope 12a through slots 22a. As shown in more detail in FIG. 7, slot 22a is aligned so that its long dimension is substantially perpendicular to the axis of conduit 26 and parallel to the rotational axis of lamp envelope 12a.

Figure 8:
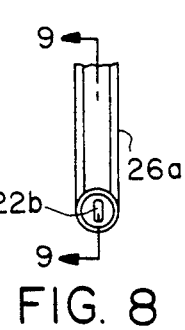
FIG. 8 is as sectional view of a slot in the end wall of a conduit.
Figure 9:
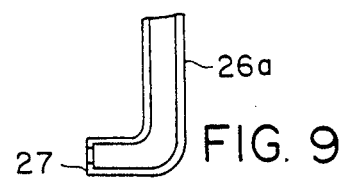
FIG. 9 is a view along line 9—9 of FIG. 8.

A slotted orifice in end wall 27 of conduit 26a is shown in FIGS. 8 and 9. As depicted, the slot is oriented so that in use its long dimension is substantially parallel to the axis of rotation of a lamp envelope.

It should be appreciated that while the invention has been described in connection with preferred embodiments illustrating a particular electrodeless lamp, it may be used with other lamps, whether or not rotated, and it should be understood that many variations in slot size, shape and orientation with respect to either or both conduit axis and envelope rotational axis may occur to those skilled in the art, and that the scope of the invention is limited solely by the claims appended hereto and equivalent thereto.

What is claimed is:

1. Apparatus for cooling an electrodeless lamp having a lamp envelope which becomes extremely hot during operation, said lamp containing a plasma-forming medium and being mounted within a chamber for containing radiation for energizing said plasma-forming medium, said apparatus comprising:
    means for providing a source of cooling gas under pressure;
    conduit means for carrying said cooling gas from said source of cooling gas into said chamber and in the vicinity of said lamp envelope; and,
    cooling gas outlet port means in a wall of said conduit means, said outlet port means comprising a slotted orifice in said wall, said orifice being oriented for directing a stream of cooling gas toward said lamp envelope.

2. Apparatus according to claim 1 wherein said conduit means comprises a side wall and an end wall and said slotted orifice is provided in said side wall.

3. Apparatus according to claim 2 wherein said slotted orifice is oriented with its longer dimension at an angle from about 30° to about 90° with respect to the axis of said conduit means.

4. Apparatus according to claim 2 wherein said slotted orifice is oriented with its longer dimension substantially perpendicular to the axis of said conduit.

5. Apparatus according to claim 1 wherein said conduit means comprises a side wall and an end wall and said slotted orifice is provided in said end wall.

6. Apparatus according to claim 1 wherein said slotted orifice has a length to width ratio from about 2:1 to about 8:1.

7. Apparatus according to claim 1 wherein said conduit is cylindrical and said slotted orifice is oriented with its longer dimension transverse to said conduit and extends through an angle from about 5 to about 60 about said cylindrical conduit.

8. Apparatus according to claim 1 further including means for rotating said lamp envelope about an axis passing through said envelope so that adjacent surface portions of said lamp envelope appear sequentially in the direct path of said stream of cooling gas.

9. Apparatus according to claim 8 wherein said slotted orifice is oriented to direct said stream of cooling gas substantially towards the axis of rotation of said lamp envelope.

10. Apparatus according to claim 8 wherein said slotted orifice is oriented so that its longer dimension is at an angle from about 0° to about 60° with respect to rotational axis of said lamp envelope.

11. Apparatus according to claim 8 wherein said slotted orifice is oriented with its longer dimension substantially perpendicular to the axis of said conduit means.

12. Apparatus according to claim 8 wherein said conduit means comprises a side wall and an end wall and said slotted orifice is provided in said side wall.

13. Apparatus according to claim 12 wherein said slotted orifice is oriented with its longer dimension at an angle from about 30° to about 90° with respect to the axis of said conduit means.

14. Apparatus according to claim 12 wherein said slotted orifice is oriented with its longer dimension substantially perpendicular to the axis of s id conduit.

15. Apparatus according to claim 12 wherein said slotted orifice is oriented with its longer dimension substantially perpendicular to the axis of said conduit and substantially parallel to the rotational axis of said lamp envelope.

16. A method of cooling a lamp envelope of an electrodeless lamp, said lamp envelope containing a plasma-forming medium and being mounted within a chamber which is supplied with radiation for energizing said plasma-forming medium, said method comprising:
    rotating said envelope about an axis;
    providing a source of pressurized cooling gas;
    providing conduit means for transporting said cooling gas into said chamber;
    passing said cooling gas from said conduit into said chamber through a slotted orifice, said slotted orifice being oriented to direct the resulting stream of cooling gas at said lamp envelope.

17. The method of claim 16 wherein said slotted orifice extends transversely to the axis of said conduit.

18. The method of claim 16 wherein said slotted orifice extends substantially parallel to the rotational axis of said lamp envelope.

* * * * *

UNITED STATES PATENT AND TRADEMARK OFFICE
CERTIFICATE OF CORRECTION

PATENT NO. : 5,021,704

DATED : June 4, 1991

INVENTOR(S) : Walker et al

It is certified that error appears in the above-identified patent and that said Letters Patent is hereby corrected as shown below:

COLUMN 6;

In claim 7, at line 16, "5" and "60" should be --$5°$-- and --$60°$--.

In claim 14, at line 43, "s id" should be --said--.

Signed and Sealed this

Twenty-ninth Day of September, 1992

Attest:

DOUGLAS B. COMER

*Attesting Officer*    *Acting Commissioner of Patents and Trademarks*